(12) United States Patent
Fujimoto et al.

(10) Patent No.: US 11,433,426 B2
(45) Date of Patent: Sep. 6, 2022

(54) VIBRATION DEVICE AND IMAGING UNIT INCLUDING VIBRATION DEVICE

(71) Applicant: Murata Manufacturing Co., Ltd., Nagaokakyo (JP)

(72) Inventors: Katsumi Fujimoto, Nagaokakyo (JP); Yuuki Ishii, Nagaokakyo (JP); Hitoshi Sakaguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/137,505

(22) Filed: Dec. 30, 2020

(65) Prior Publication Data

US 2021/0154703 A1    May 27, 2021

Related U.S. Application Data

(63) Continuation of application No. PCT/JP2020/023501, filed on Jun. 16, 2020.

(30) Foreign Application Priority Data

Nov. 22, 2019  (JP) .............................. JP2019-211260

(51) Int. Cl.
*B06B 1/06* (2006.01)
*G02B 7/02* (2021.01)
(Continued)

(52) U.S. Cl.
CPC .......... *B06B 1/0655* (2013.01); *B06B 1/0207* (2013.01); *G02B 7/02* (2013.01);
(Continued)

(58) Field of Classification Search
CPC ... B06B 1/0207; B06B 1/0625; B06B 1/0655; G02B 27/0006; G02B 7/02; G02B 7/026;
(Continued)

(56) References Cited

U.S. PATENT DOCUMENTS

| 11,077,464 B2* | 8/2021 | Fujimoto | ............... G03B 17/02 |
| 2005/0153019 A1* | 7/2005 | Fuchs | ..................... A23L 33/12 |
| | | | 426/72 |

(Continued)

FOREIGN PATENT DOCUMENTS

| CN | 109564346 A | 4/2019 |
| JP | 6579200 B2 | 9/2019 |

(Continued)

OTHER PUBLICATIONS

Official Communication issued in International Patent Application No. PCT/JP2020/023501, dated Sep. 8, 2020.

(Continued)

*Primary Examiner* — Amy R Hsu
(74) *Attorney, Agent, or Firm* — Keating & Bennett, LLP (57) ABSTRACT

A vibration device includes a protective cover to transmit light with a predetermined wavelength, a first cylindrical body to hold the protective cover at one end, a plate spring to support the other end of the first cylindrical body, a second cylindrical body to support, at one end, a portion of the plate spring in an outer side portion of a portion that supports the first cylindrical body, and a vibrating body that is provided at the other end of the second cylindrical body to vibrate in an axial direction of the second cylindrical body.

20 Claims, 7 Drawing Sheets

(51) Int. Cl.
*G03B 17/02* (2021.01)
*B06B 1/02* (2006.01)
*H04N 5/225* (2006.01)
*H01L 41/09* (2006.01)
*G03B 17/56* (2021.01)

(52) U.S. Cl.
CPC ............. *G03B 17/02* (2013.01); *G03B 17/56* (2013.01); *H01L 41/09* (2013.01); *H04N 5/2251* (2013.01)

(58) Field of Classification Search
CPC ........ G03B 17/02; G03B 17/08; G03B 17/56; G03B 30/00; H01L 41/09; H04N 5/2251; H04N 5/22521
See application file for complete search history.

(56) References Cited

U.S. PATENT DOCUMENTS

| | | | | |
|---|---|---|---|---|
| 2007/0183771 A1* | 8/2007 | Takanashi | ............. | G03B 17/02 396/429 |
| 2009/0262232 A1* | 10/2009 | Kim | .............. | G02B 7/102 348/340 |
| 2010/0085474 A1* | 4/2010 | Morita | ................ | H04N 5/2253 348/374 |
| 2017/0046818 A1* | 2/2017 | Kiyamura | ............ | G02B 27/646 |
| 2018/0210194 A1 | 7/2018 | Nishiyama et al. | | |
| 2018/0239218 A1 | 8/2018 | Ikeuchi et al. | | |
| 2019/0113744 A1* | 4/2019 | Magee | ................... | B08B 7/026 |
| 2019/0171004 A1 | 6/2019 | Bretagnol et al. | | |
| 2019/0176195 A1 | 6/2019 | Fujimoto et al. | | |
| 2020/0038914 A1* | 2/2020 | Fujimoto | ............. | B06B 1/0625 |
| 2020/0213495 A1 | 7/2020 | Fujimoto et al. | | |

FOREIGN PATENT DOCUMENTS

| | | |
|---|---|---|
| KR | 10-2013-0032136 A | 4/2013 |
| WO | 2017/110563 A1 | 6/2017 |
| WO | 2018/100795 A1 | 6/2018 |
| WO | 2019/130623 A1 | 7/2019 |
| WO | 2019/130629 A1 | 7/2019 |

OTHER PUBLICATIONS

Official Communication issued in corresponding European Patent Application No. 20829783.8, dated Feb. 10, 2022.
Office Action in CN202080006214.3, dated Jul. 20, 2022, 7 pages.

* cited by examiner

VIBRATION DEVICE AND IMAGING UNIT INCLUDING VIBRATION DEVICE

CROSS REFERENCE TO RELATED APPLICATIONS

This application claims the benefit of priority to Japanese Patent Application No. 2019-211260 filed on Nov. 22, 2019 and is a Continuation Application of PCT Application No. PCT/JP2020/023501 filed on Jun. 16, 2020. The entire contents of each application are hereby incorporated herein by reference.

BACKGROUND OF THE INVENTION

1. Field of the Invention

The present disclosure relates to a vibration device and an imaging unit including the vibration device.

2. Description of the Related Art

In recent years, in a vehicle equipped with an imaging unit including an imaging element or the like in a front portion or a rear portion of a vehicle, a safety device is controlled by using an image obtained by the imaging unit, or an automatic driving control is performed. Since such an imaging unit is often provided outside a vehicle, foreign matter, such as raindrops (water droplets), mud, dust, and the like, may adhere to a light transmissive body (a protective cover or a lens) that covers an exterior of the imaging unit. When the foreign matter adheres to the light transmissive body, the attached foreign matter is reflected on the image obtained by the imaging unit, and a sharp image cannot be obtained.

Therefore, an imaging unit described in Japanese Patent No. 6579200 is provided with a vibration device for vibrating a light transmissive body in order to remove foreign matter adhering to a surface of the light transmissive body. The vibration device is configured to include a support body, a first vibration element arranged on one main surface side of the support body, and a second vibration element arranged on the other main surface side. The vibration device vibrates a second vibrating body provided with a piezoelectric vibrator to thereby vibrate a first vibrating body having a light-transmitting property, and thus removes foreign matter adhering to the surface of the light transmissive body.

In addition, an imaging unit described in International Publication No. WO2017/110563 includes, in order to vibrate a lens cover that covers one cavity of a cylindrical vibrating body, a vibration device in which a cylindrical mode conversion coupling portion is provided between the cylindrical vibrating body and a light transmissive body portion of the lens cover.

The imaging units described in Japanese Patent No. 6579200 and International Publication No. WO2017/110563 are based on the premise that the vibration device using a vibration mode for displacing an in-plane portion of the light transmissive body is provided. Therefore, in the imaging units described in Japanese Patent No. 6579200 and International Publication No. WO2017/110563, the light transmissive body is vibrated by using the vibration device so that an in-plane portion of the light transmissive body differs in displacement from another portion. Specifically, when vibrating the light transmissive body in a certain vibration mode, the vibration device vibrates the light transmissive body so that a central portion of the light transmissive body has a maximum displacement.

In a case where the central portion of the light transmissive body is vibrated so as to have the maximum displacement, the vibration device can move the raindrops adhering to the surface of the light transmissive body to the central portion of the light transmissive body and atomize the raindrops. That is, since a position where the displacement of the light transmissive body is large becomes hydrophilic by causing the vibration device to vibrate the light transmissive body, it is possible to move the raindrop at a position where the displacement is small to a position where the displacement is large by a surface tension difference. However, an amount of raindrops that can be moved by vibrating the light transmissive body by the vibration device depends on the distance from the position of the maximum displacement and a magnitude of the maximum displacement, and an ability to remove raindrops (foreign matter) greatly changes depending on the vibration mode of the vibration device. Further, in the vibration device, raindrops (foreign matter) gather at the position of the light transmissive body having the maximum displacement, and thus there has been a concern that the field of view at the position may be obstructed until the collected rain droplets (foreign matter) are atomized.

SUMMARY OF THE INVENTION

Preferred embodiments of the present invention provide vibration devices that are each capable of removing foreign matter adhering to a light transmissive body while maintaining a field of view of the light transmissive body, and imaging units each including a vibration device.

A vibration device according to a preferred embodiment of the present invention includes a light transmissive body to transmit light with a predetermined wavelength, a first cylindrical body to hold the light transmissive body at one end, a plate-shaped spring portion to support another end of the first cylindrical body, a second cylindrical body to support, at one end, a portion of the spring portion in an outer side portion of a portion that supports the first cylindrical body, and a vibrating body provided at another end of the second cylindrical body to vibrate an axial direction of the second cylindrical body.

An imaging unit according to a preferred embodiment of the present invention includes a vibration device according to a preferred embodiment of the present invention and an imaging element arranged so that the light transmissive body is in a field of view direction.

According to preferred embodiments of the present invention, vibration devices and imaging units each including a vibration device are each able to remove foreign matter adhering to a light transmissive body while maintaining the field of view of the light transmissive body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, vibration devices and imaging units each including a vibration device according to one of the preferred embodiments will be described in detail with reference to the drawings. Note that the same reference numerals in the drawings denote the same or corresponding elements and portions.

Preferred Embodiment 1

Figure 1:
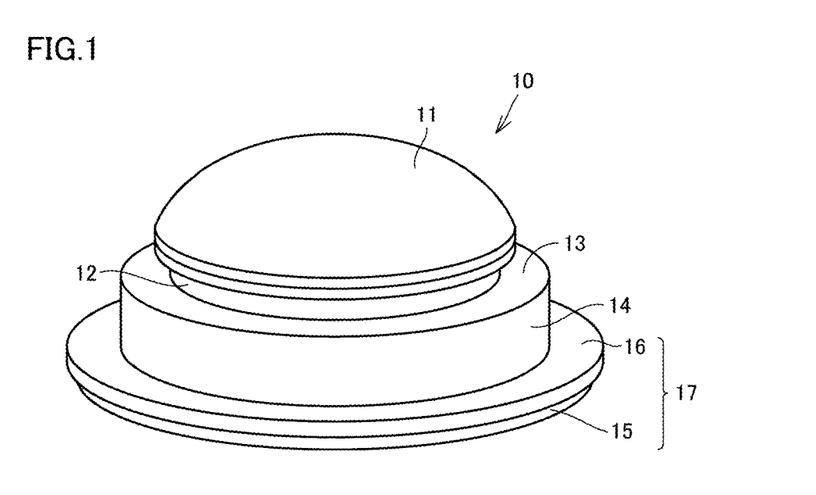
FIG. 1 is a perspective view of a vibration device according to Preferred Embodiment 1 of the present invention.

Hereinafter, a vibration device and an imaging unit including the vibration device according to Preferred Embodiment 1 will be described with reference to the drawings. FIG. 1 is a perspective view of a vibration device 10 according to Preferred Embodiment 1. The vibration device 10 includes a protective cover 11, a first cylindrical body 12, a plate spring 13, a second cylindrical body 14, and a vibrating body 17.

The protective cover 11 preferably has a dome shape. The protective cover 11 includes a transparent member as a light transmissive body that transmits light with a predetermined wavelength. An end portion of the protective cover 11 is held by an end portion of the first cylindrical body 12 having a cylindrical shape. The first cylindrical body 12 is supported by the plate spring 13 that elastically deforms on a side opposite to the protective cover 11 side. The plate spring 13 supports a bottom surface of the cylindrical first cylindrical body 12, and extends outward from the supported position. The plate spring 13 preferably has a hollow circular or substantially circular shape, and surrounds a circumference of the first cylindrical body 12 in a circular or substantially circular shape.

The plate spring 13 is supported by the second cylindrical body 14 at a position in an outer side portion of a position that supports the first cylindrical body 12. The second cylindrical body 14 has a cylindrical shape. The second cylindrical body 14 supports the plate spring 13 at one end thereof. The vibrating body 17 is provided at the other end of the second cylindrical body 14. The vibrating body 17 vibrates in an axial direction of the second cylindrical body 14 (in a vertical direction in FIG. 1). The vibrating body 17 includes a piezoelectric element 15 and a vibrating plate 16. The piezoelectric element 15 preferably has a hollow circular or substantially circular shape and is provided on a lower surface of the vibrating plate 16. The vibrating plate 16 supports a bottom surface of the second cylindrical body 14, and extends outward from the supported position. The vibrating plate 16 preferably has a hollow circular or substantially circular shape, and surrounds a circumference of the second cylindrical body 14 in a circular or substantially circular shape. The piezoelectric element 15 vibrates in the axial direction of the second cylindrical body 14, such that the vibrating plate 16 vibrates in the axial direction of the second cylindrical body 14. Note that a plurality of rectangular or substantially rectangular piezoelectric elements 15 may be concentrically provided on the lower surface of the vibrating plate 16. In addition, the piezoelectric element 15 having a hollow circular or substantially circular shape may be provided on an upper surface of the vibrating plate 16. In addition, the plurality of rectangular or substantially rectangular piezoelectric elements 15 may be concentrically provided on the upper surface of the vibrating plate 16. Further, the piezoelectric element 15 may have a shape corresponding to the shape of the vibrating plate 16, and the piezoelectric element 15 and the vibrating plate 16 may be integrally provided.

The first cylindrical body 12, the plate spring 13, the second cylindrical body 14, and the vibrating plate 16 are integrally provided. The first cylindrical body 12, the plate spring 13, the second cylindrical body 14, and the vibrating plate 16 are preferably made of, for example, metal or synthetic resin. Note that the first cylindrical body 12, the plate spring 13, the second cylindrical body 14, and the vibrating plate 16 may be separately provided, or may be defined by separate members. A method of joining the protective cover 11 and the first cylindrical body 12 is not particularly limited. The protective cover 11 and the first cylindrical body 12 may be joined to each other by an adhesive, welding, fitting, press-fitting, or the like, for example.

In Preferred Embodiment 1, the protective cover 11 is preferably made of glass, for example. However, the protective cover 11 is not limited to glass, and may be made of a resin such as a transparent plastic, for example. Alternatively, the protective cover 11 may be made of a light transmissive ceramic material, for example. However, depending on the application, it is preferable to use tempered glass, such that the strength can be increased. In the case of the resin, the protective cover 11 may be an acrylic, a cycloolefin, a polycarbonate, a polyester, or the like, for example. Further, the protective cover 11 may include a coating layer made of diamond-like carbon (DLC) or the like, for example, provided on the surface thereof so as to increase the strength, and a coating layer such as a hydrophilic film, a water-repellent film, a hydrophilic film, an oil repellent film, or the like, for example, may be provided to prevent contamination of the surface, remove raindrops, and the like, for example.

The dome shape of the protective cover 11 is not limited to a hemispherical shape. A shape obtained by connecting a cylinder to a hemisphere, a curved shape smaller than the hemisphere, or the like, for example, may be included. The protective cover 11 may be a flat plate. It does not matter whether the light transmitted through the protective cover 11 is visible light or invisible light. The protective cover 11 may be a cover made of glass, or may be made of an optical component such as a concave lens, a convex lens, or a flat lens, for example.

The piezoelectric element 15 vibrates, for example, by polarization in the thickness direction. The piezoelectric element 15 is preferably made of lead zirconate titanate-based piezoelectric ceramics, for example. However, other piezoelectric ceramics, such as (K, Na) NbO$_3$, for example, may be used. Further, a piezoelectric single crystal, such as LiTaO$_3$, for example, may be used.

Figure 2:
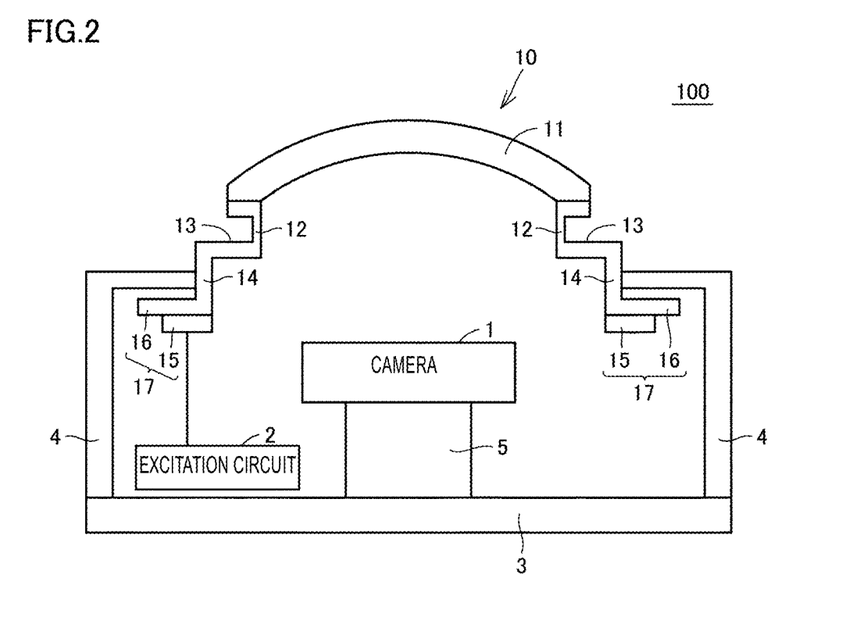
FIG. 2 is a schematic diagram for explaining a configuration of an imaging unit according to Preferred Embodiment 1 of the present invention.

FIG. 2 is a schematic diagram for explaining a configuration of an imaging unit 100 according to Preferred Embodiment 1. FIG. 2 is a sectional view of the vibration device 10 in which the vibration device 10 of FIG. 1 is cut at the center in the axial direction (the vertical direction in the figure) of the second cylindrical body 14 with respect to the protective cover 11. The imaging unit 100 is attached, for example, on a front side, a rear side, or the like of a vehicle, and images an object to be imaged. Note that a location where the imaging unit 100 is attached is not limited to the vehicle, and may be attached to another device such as a ship, an airplane, or the like, for example.

The imaging unit 100 includes the vibration device 10 and a camera 1 as an imaging element housed in the vibration device 10. The camera 1 is fixed to an upper end portion of a main body member 5 fixed to a base member 3. The vibration device 10 is supported by a support member 4 fixed to the base member 3.

In a case where the imaging unit 100 is attached to a vehicle or the like and is used outdoors, foreign matter, such as raindrops, mud, dust, and the like, for example, may adhere to the protective cover 11 that is provided in a visual field of the camera 1 and covers an exterior thereof. The vibration device 10 can generate a vibration to remove foreign matter, such as raindrops or the like, for example, adhering to the protective cover 11.

The vibration device 10 includes an excitation circuit that applies a drive signal to generate a vibration to the piezoelectric element 15. The excitation circuit 2 is connected to the piezoelectric element 15. The piezoelectric element 15 vibrates in the axial direction of the second cylindrical body 14 based on the drive signal from the excitation circuit 2. The vibration of the piezoelectric element 15 causes the vibrating plate 16 to vibrate in the axial direction of the second cylindrical body 14, and the vibrating plate 16 causes the second cylindrical body 14 to vibrate in the axial direction of the second cylindrical body 14. The vibration of the second cylindrical body 14 makes it possible to transmit the vibration of the piezoelectric element 15 to the first cylindrical body 12 via the plate spring 13. In the vibration device 10, the first cylindrical body 12 is vibrated to vibrate the protective cover 11, so as to remove foreign matter, such as raindrops or the like, for example, adhering to the protective cover 11.

The excitation circuit 2 applies a drive signal to the piezoelectric element 15 so that the first cylindrical body 12 and the second cylindrical body 14 vibrate in opposite phase in the axial direction of the second cylindrical body 14. The excitation circuit 2 can vibrate the vibration device 10 in a vibration mode other than that the first cylindrical body 12 and the second cylindrical body 14 vibrate in opposite phase in the axial direction of the second cylindrical body 14 by the drive signal applied to the piezoelectric element 15.

As illustrated in FIG. 2, a thickness of the first cylindrical body 12 is thinner than a thickness of the plate spring 13 and the second cylindrical body 14. The thickness of the first cylindrical body 12 is shorter than a length from a position of the plate spring 13 supporting the first cylindrical body 12 to a position of the plate spring 13 supported by the second cylindrical body 14.

Figure 3A:
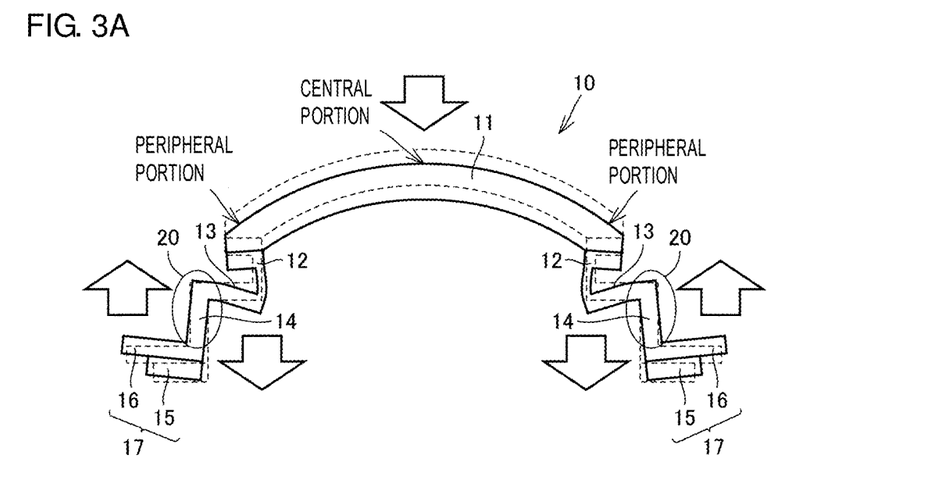
FIGS. 3A and 3B include diagrams for explaining vibration of the vibration device according to Preferred Embodiment 1 of the present invention and vibration of a vibration device for comparison.
Figure 3B:
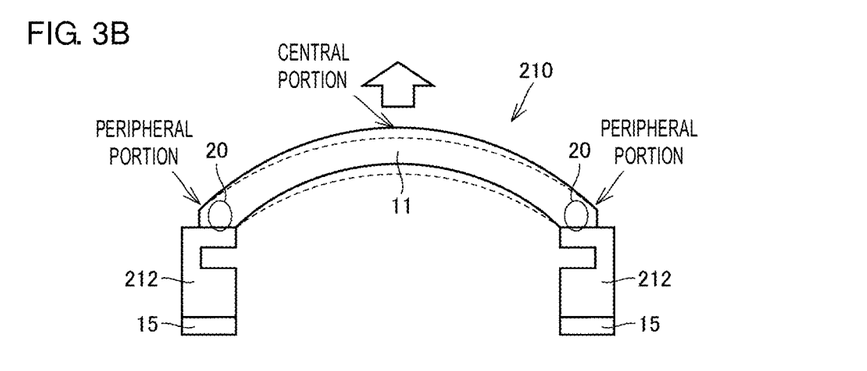

FIGS. 3A and 3B include diagrams for explaining vibration of the vibration device 10 according to Preferred Embodiment 1 and vibration of a vibration device 210 for comparison. FIG. 3A illustrates an example of vibration of the vibration device 10 according to Preferred Embodiment 1, and FIG. 3B illustrates an example of vibration of the vibration device 210 for comparison. In the vibration device 10 according to Preferred Embodiment 1, the first cylindrical body 12 is uniformly or substantially uniformly displaced in the vertical direction due to the vibration of the piezoelectric element 15, such that the entirety of the protective cover 11 vibrates in the vertical direction uniformly or substantially uniformly. On the other hand, in the vibration device 210 for comparison, due to the vibration of the piezoelectric element 15, the protective cover 11 vibrates so as to be most largely displaced in the vertical direction in a central portion and not displaced in a peripheral portion. In FIGS. 3A and 3B, reference positions of the vibration devices 10 and 210 before the start of the vibration are indicated by broken lines, and positions of the vibration devices 10 and 210 after the displacement is indicated by solid lines.

Referring to FIG. 3A, when the piezoelectric element 15 vibrates in the axial direction of the second cylindrical body 14 based on the drive signal from the excitation circuit 2 (see FIG. 2), the vibrating plate 16 is displaced upward. Therefore, the second cylindrical body 14 is also displaced upward, and the position of the plate spring 13 supporting the first cylindrical body 12 sinks downward. As the position of the plate spring 13 supporting the first cylindrical body 12 sinks downward, the entirety of the first cylindrical body 12 is displaced downward, and as a result, the entirety of the protective cover 11 held by the first cylindrical body 12 is also displaced downward. At this time, a node (a portion which is not displaced even by the vibration of the piezoelectric element 15) 20 is provided on a side surface of the second cylindrical body 14.

Although not illustrated, when the piezoelectric element 15 vibrates in the axial direction of the second cylindrical body 14 based on the drive signal from the excitation circuit 2 (see FIG. 2), the vibrating plate 16 is displaced downward. Therefore, the second cylindrical body 14 is also displaced downward, and the position of the plate spring 13 supporting the first cylindrical body 12 rises upward. As the position of the plate spring 13 supporting the first cylindrical body 12 rises upward, the entirety of the first cylindrical body 12 is displaced upward, and as a result, the entirety of the protective cover 11 held by the first cylindrical body 12 is also displaced upward. At this time, the node 20 is provided on the side surface of the second cylindrical body 14.

As illustrated in FIG. 3A, in the vibration device 10 according to Preferred Embodiment 1, the entirety of the protective cover 11 is uniformly or substantially uniformly displaced in the vertical direction without substantially deforming the protective cover 11 due to the vibration of the piezoelectric element 15.

On the other hand, the vibration device 210 for comparison illustrated in FIG. 3B cannot cause the entirety of the protective cover 11 to vibrate so as to be displaced uniformly or substantially uniformly in the vertical direction, but can cause the central portion of the protective cover 11 to vibrate so as to be displaced most largely in the vertical direction.

Specifically, referring to FIG. 3B, the vibration device 210 for comparison includes the protective cover 11, a first cylindrical body 212, and the piezoelectric element 15. The protective cover 11 is held at an end portion of the cylindrical first cylindrical body 212. The first cylindrical body 212 has a structure in which a partially recessed portion is provided on an inner surface close to an end portion on which the piezoelectric element 15 is provided. The piezoelectric element 15 vibrates in the axial direction of the first cylindrical body 212 based on the drive signal from the excitation circuit 2 (see FIG. 2), such that the vibration is transmitted to the protective cover 11 via the first cylindrical body 212, and the protective cover 11 vibrates so as to be most largely displaced in the upward direction in the central portion thereof. At this time, the node 20 is provided in the peripheral portion of the protective cover 11. As illustrated in FIG. 3B, in the vibration device 210 for comparison, due to the vibration of the piezoelectric element 15, the protective cover 11 vibrates so as to be most largely displaced in the vertical direction in the central portion and not to be displaced in the peripheral portion.

A difference in vibration between the vibration device 10 according to Preferred Embodiment 1 and the vibration device 210 for comparison target depends on a difference in structure between the vibration device 10 and the vibration device 210. However, also in the vibration device 10 according to Preferred Embodiment 1, when the frequency for excitation is increased, the protective cover 11 vibrates so as to be most largely displaced in the vertical direction in the central portion and not to be displaced in the peripheral portion, because of its structure, as in the case of the vibration device 210 for comparison. That is, the vibration device 10 has a structure capable of being vibrated in a plurality of different vibration modes depending on the frequency for excitation. Here, the frequency at which the vibration device 10 is excited can be adjusted by changing the frequency of the drive signal to be applied to the piezoelectric element 15. Hereinafter, as in a manner of the vibration device 210 for comparison, that is, the protective cover 11 vibrates so as to be most largely displaced in the vertical direction in the central portion and not to be displaced in the peripheral portion, which will be referred to as a protective cover vibration, and such a vibration mode will be referred to as a protective cover vibration mode. On the contrary, in the vibration device 10 according to Preferred Embodiment 1, the entirety of the protective cover 11 uniformly or substantially uniformly vibrates in the vertical direction, which will be referred to as a piston vibration (plate spring vibration), and such a vibration mode is referred to as a piston vibration mode.

Figure 4:
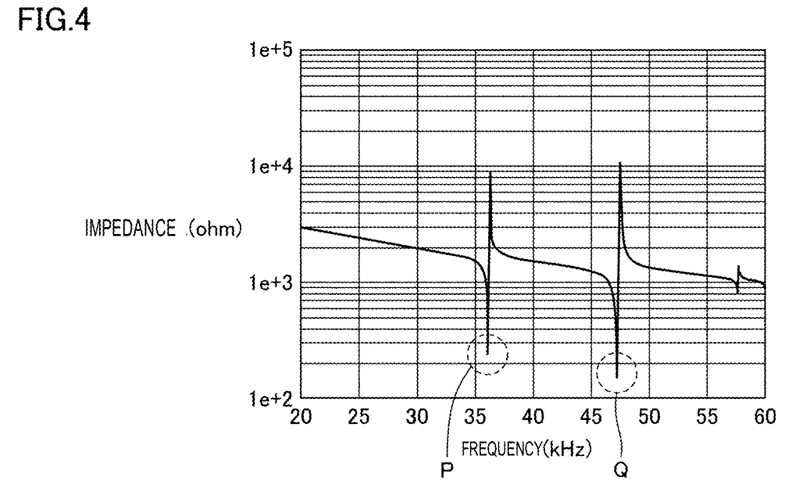
FIG. 4 is a diagram illustrating a relationship between a frequency and an impedance of a drive signal to be applied to a piezoelectric element in the vibration device according to Preferred Embodiment 1 of the present invention.

FIG. 4 is a diagram illustrating a relationship between the frequency and the impedance of the drive signal to be applied to the piezoelectric element 15 in the vibration device 10 according to Preferred Embodiment 1. As can be seen from a portion indicated by a position P in FIG. 4, the impedance of the piezoelectric element 15 largely changes around about 36 kHz. The position P indicates the frequency of the drive signal in a case where the protective cover 11 vibrates in the piston vibration mode. Hereinafter, the frequency of the drive signal in the case where the protective cover 11 vibrates in the piston vibration mode will be referred to as a "resonant frequency of the piston vibration mode". As can be seen from the portion indicated by the position Q in FIG. 4, the impedance of the piezoelectric element 15 largely changes around about 47 kHz greater than the frequency at the position P. The position Q indicates the frequency of the drive signal in a case where the protective cover 11 vibrates in the protective cover vibration mode. Hereinafter, the frequency of the drive signal in the case where the protective cover 11 vibrates in the protective cover vibration mode will be referred to as a "resonant frequency of the protective cover vibration mode".

As illustrated in FIG. 4, in the vibration device 10, the vibration mode is changed depending on the frequency of the drive signal to be applied to the piezoelectric element 15. The resonant frequency of the piston vibration mode is about 36 kHz, whereas the resonant frequency of the protective cover vibration mode is large, which is about 47 kHz. Supposing that the resonant frequency of the piston vibration mode and the resonant frequency of the protective cover vibration mode are close to each other, the vibration device 10 cannot vibrate the protective cover 11 only in the piston vibration mode. Here, the relationship between the resonant frequency of the piston vibration mode and the resonant frequency of the protective cover vibration mode varies depending on the structure of the vibration device 10. In particular, the relationship between the resonant frequency of the piston vibration mode and the resonant frequency of the protective cover vibration mode varies greatly depending on the thickness of the protective cover 11.

Figure 5:
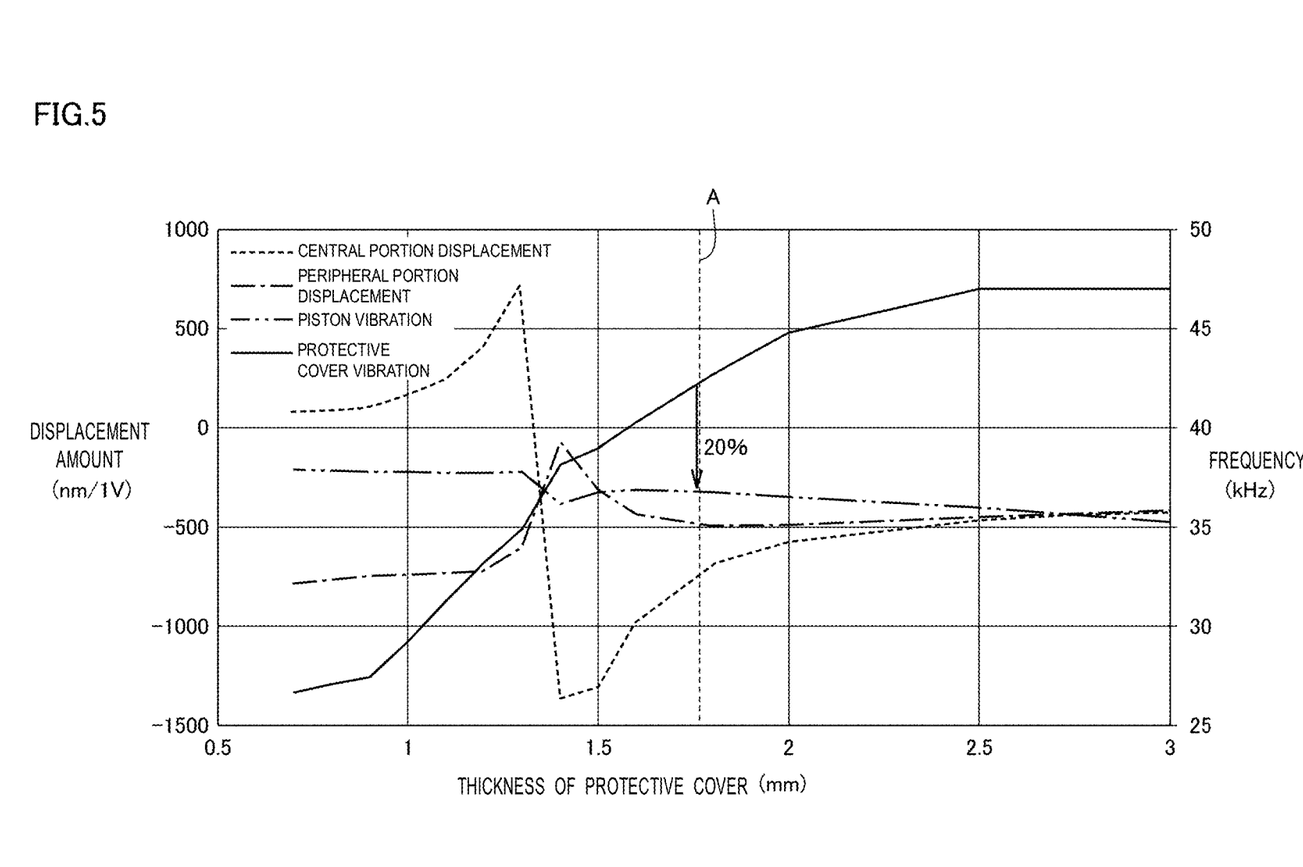
FIG. 5 is a graph showing a relationship between a resonant frequency of a piston vibration mode and a resonant frequency of a protective cover vibration mode depending on a change in thickness of the protective cover according to Preferred Embodiment 1 of the present invention.

FIG. 5 is a graph showing a relationship between the resonant frequency of the piston vibration mode and the resonant frequency of the protective cover vibration mode depending on the change in the thickness of the protective cover 11 according to Preferred Embodiment 1. In FIG. 5, the resonant frequency of the plate spring vibration by the piston vibration mode at the position P in FIG. 4 and the resonant frequency of the protective cover vibration by the protective cover vibration mode at the position Q are plotted. FIG. 5 shows a change in displacement of the central portion and a change in displacement of the peripheral portion of the protective cover 11 in a case where the thickness of the protective cover 11 is changed regarding the shape thereof as a flat plate, instead of a dome shape, and the vibration device 10 is vibrated at the resonant frequency of the piston vibration mode. As can been seen from FIG. 5, the resonant frequency of the piston vibration mode gradually decreases as the thickness of the protective cover 11 increases. On the other hand, the resonant frequency of the protective cover vibration mode increases as the thickness of the protective cover 11 increases.

When the thickness of the protective cover 11 is about 1.35 mm, the resonant frequency of the protective cover vibration mode is the same or substantially the same as the resonant frequency of the piston vibration mode. That is, when the protective cover 11 has the thickness of about 1.35 mm, the vibration device 10 cannot perform driving by separating the protective cover vibration mode and the piston vibration mode. Before and after the point at which the resonant frequencies are the same or approximately the same, the displacement in the central portion displacement of the protective cover 11, which has increased along with the thickness of the protective cover 11, sharply decreases. Further, before and after this point, the displacement in the peripheral portion displacement of the protective cover 11, which has gradually increased along with the thickness of the protective cover 11, sharply increases. In a region where the thickness of the protective cover 11 is thicker than about 1.35 mm, the resonant frequency of the protective cover vibration mode has a value larger than the resonant frequency of the piston vibration mode. Note that, the above-described example is configured such that the thickness of the protective cover 11 is changed and the resonant frequency of the protective cover vibration mode is larger than the resonant frequency of the piston vibration mode. However, the protective cover 11, the first cylindrical body 12, the plate spring 13, and the second cylindrical body 14 may be configured such that the resonant frequency of the protective cover vibration mode is greater than the resonant frequency of the piston vibration mode.

As can be seen from FIG. 5, in a region where the resonant frequency of the protective cover vibration mode is higher than the resonant frequency of the piston vibration mode, the displacement of the central portion and the displacement of the peripheral portion of the protective cover 11 converge to the same or substantially the same displacement, and the entirety of the protective cover 11 is displaced. That is, in this region, the vibration device 10 can vibrate the protective cover 11 in the piston vibration mode as illustrated in FIG. 3A. In particular, in a region on the right side of a broken line A in FIG. 5, the displacement of the central portion and the displacement of the peripheral portion of the protective cover 11 per unit voltage converge at around −500 (nm/1V). The thickness of the protective cover 11 on the broken line A is about 1.75 mm. Further, the resonant frequency of the protective cover vibration mode on the broken line A is about 1.2 times the resonant frequency of the piston vibration mode. In a case where the resonant frequency of the protective cover vibration mode is equal to or more than about 1.2 times the resonant frequency of the piston vibration mode, the vibration device 10 can vibrate the protective cover 11 in the piston vibration mode. In the region on the right side of the broken line A, since the resonant frequency of the protective cover vibration mode is equal to or more than about 1.2 times the resonant frequency of the piston oscillation mode, the vibration device 10 makes it easy to vibrate the protective cover 11 in the piston vibration mode. Note that, the above-described example is configured such that the thickness of the protective cover 11 is changed and the resonant frequency of the protective cover vibration mode is about 1.2 times the resonant frequency of the piston vibration mode. However, the protective cover 11, the first cylindrical body 12, the plate spring 13, and the second cylindrical body 14 may be configured so that the resonant frequency of the protective cover vibration mode is about 1.2 times the resonant frequency of the piston vibration mode.

As illustrated in FIG. 5, when the thickness of the protective cover 11 is equal to or greater than about 2.5 mm, the displacement of the central portion and the displacement of the peripheral portion have the same or substantially the same displacement difference. At this time, the resonant frequency of the protective cover vibration mode is about 1.3 times the resonant frequency of the piston vibration mode.

As described above, the vibration device 10 according to Preferred Embodiment 1 includes the protective cover 11, the first cylindrical body 12, the plate spring 13, the second cylindrical body 14, the piezoelectric element 15, and the vibrating plate 16. The vibration device 10 vibrates the piezoelectric element 15 in the piston vibration mode, such that the vibrating plate 16, the second cylindrical body 14, and the plate spring 13 are displaced, and the first cylindrical body 12 is displaced uniformly or substantially uniformly up and down. As a result, the entirety of the protective cover 11 is uniformly or substantially uniformly vibrated in the vertical direction without substantially deforming the protective cover 11 itself, and thus the foreign matter (for example, raindrops or the like) adhering to the protective cover 11 is atomized in situ. Since the vibration device 10 can atomize the foreign matter adhering to the protective cover 11 in situ, it is possible to remove the foreign matter without obstructing the field of view of the protective cover 11 as compared with a case where the foreign matter is collected at one place in the protective cover 11 and then atomized.

Further, the vibration device 10 includes the protective cover 11, the first cylindrical body 12, the plate spring 13, and the second cylindrical body 14 that are configured so that the resonant frequency of the protective cover vibration mode is larger than the resonant frequency of the piston vibration mode, and further includes the excitation circuit 2 that drives the piezoelectric element 15. In a resonant system in which the resonant frequency of the protective cover 11 (the resonant frequency of the protective cover vibration mode) is equal to or more than about 1.2 times the resonant frequency of the plate spring 13 (the resonant frequency of the piston vibration mode), the excitation circuit 2 can selectively excite the resonance (the protective cover vibration) of the protective cover 11 and the resonance (the piston vibration) of the plate spring 13. That is, in the vibration device 10, it is possible to selectively switch the vibration mode between the protective cover vibration mode and the piston vibration mode. Accordingly, when the vibration device 10 uses the protective cover vibration mode, the foreign material adhering to the protective cover 11 can be collected and atomized at the center of the protective cover 11, and when the piston vibration mode is used, the foreign matter adhering to the protective cover 11 including that on the peripheral portion can be atomized there at one time. That is, in the vibration device 10, it is possible to remove the foreign matter adhering to the protective cover 11 while maintaining the field of view of the protective cover 11 by selectively using the vibration mode in accordance with the application.

Further, the thickness of the first cylindrical body 12 is shorter than a length from a position of the plate spring 13 supporting the first cylindrical body 12 to a position of the plate spring 13 supported by the second cylindrical body 14. Accordingly, the vibration device 10 can remove the foreign matter adhering to the protective cover 11 while maintaining the field of view of the protective cover 11.

In addition, in the vibration device 10, in a case where the protective cover 11 vibrates in the piston vibration mode, the node 20 is provided on the side surface of the second cylindrical body 14. Since the side surface of the second cylindrical body 14 is supported by the support member 4, the vibration transmitted to the second cylindrical body 14 due to the vibration of the piezoelectric element 15 does not transmit to the support member 4, and therefore, the vibration is sufficiently transmitted to the protective cover 11.

Figure 6:
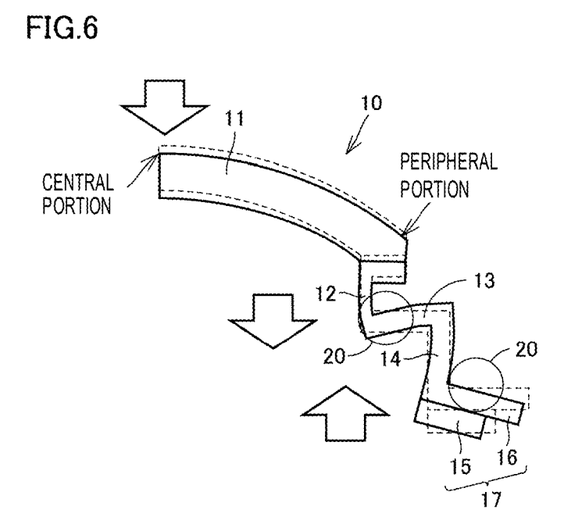
FIG. 6 is a diagram illustrating another example of a node position in a case where the vibration device according to Preferred Embodiment 1 of the present invention is vibrated in the piston vibration mode.

In addition, in the vibration device 10, it has been described that the node 20 is provided on the side surface of the second cylindrical body in the case where the protective cover 11 is vibrated in the piston vibration mode. However, a piston vibration mode in which the node is provided at a different position is also provided. FIG. 6 is a diagram illustrating another example of the node position in a case where the vibration device according to Preferred Embodiment 1 is vibrated in the piston vibration mode. In a case where the vibration device 10 is driven in the piston vibration mode at a frequency higher than the resonant frequency of the piston vibration mode in FIG. 3A, the node 20 is provided at the position of the plate spring 13 supporting the first cylindrical body 12 and the position of the vibrating plate 16 supporting the second cylindrical body 14, as illustrated in FIG. 6.

Figure 7:
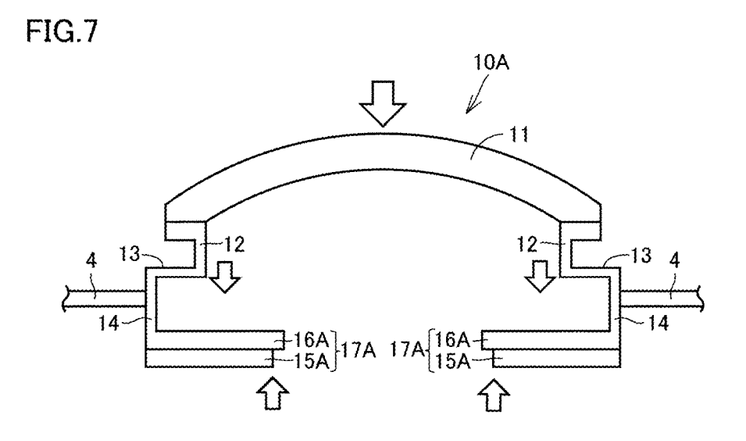
FIG. 7 is a sectional view of a vibration device according to a modified example of Preferred Embodiment 1 of the present invention.

Referring to FIG. 7, a modified example of Preferred Embodiment 1 will be described. Note that the same or corresponding components as those in Preferred Embodiment 1 are denoted by the same reference numerals, and the description thereof will not be repeated. FIG. 7 is a sectional view of a vibration device 10A according to the modified example of Preferred Embodiment 1. The vibration device 10A is different from the vibration device 10 in that a vibrating body 17A extends toward an inside of the vibration device 10A.

The vibrating body 17A is provided in the other end of the second cylindrical body 14 (the second cylindrical body 14 supports the plate spring 13 at one end), and vibrates in the axial direction of the second cylindrical body 14 (in the vertical direction in the figure). The vibrating body 17A includes a piezoelectric element 15A and a vibrating plate 16A. The piezoelectric element 15A preferably has a hollow circular or substantially circular shape, and is provided on a lower surface of the vibrating plate 16A. The vibrating plate 16A supports the bottom surface of the second cylindrical body 14, and extends inward from the supported position. The vibrating plate 16A preferably has a hollow circular or substantially circular shape, and is provided inside the second cylindrical body 14. The piezoelectric element 15A vibrates in the axial direction of the second cylindrical body 14, whereby the vibrating plate 16A vibrates in the axial direction of the second cylindrical body 14.

The piezoelectric element 15A vibrates in the axial direction of the second cylindrical body 14 based on the drive signal from the excitation circuit 2 (see FIG. 2), such that the vibrating plate 16A is displaced upward. Therefore, the second cylindrical body 14 is also displaced upward, and the position of the plate spring 13 supporting the first cylindrical body 12 sinks downward. As the position of the plate spring 13 supporting the first cylindrical body 12 sinks downward, the entirety of the first cylindrical body 12 is displaced downward, and as a result, the entirety of the protective cover 11 held by the first cylindrical body 12 is also displaced downward. At this time, the side surface of the second cylindrical body 14 is not displaced even by the vibration of the piezoelectric element 15A.

Further, the piezoelectric element 15 vibrates in the axial direction of the second cylindrical body 14 based on the drive signal from the excitation circuit 2 (see FIG. 2), such that the vibrating plate 16A is displaced downward. Therefore, the second cylindrical body 14 is also displaced downward, and the position of the plate spring 13 that supports the first cylindrical body 12 rises upward. As the position of the plate spring 13 supporting the first cylindrical body 12 rises upward, the entirety of the first cylindrical body 12 is displaced upward, and as a result, the entirety of the protective cover 11 held by the first cylindrical body 12 is also displaced upward. At this time, the side surface of the second cylindrical body 14 is not displaced even by the vibration of the piezoelectric element 15A.

As described above, since the vibration device 10A can vibrate the protective cover 11 in the piston vibration mode similarly to the vibration device 10, the same or substantially the same advantageous effects as those of the vibration device 10 can be obtained. Note that, in the vibration device 10A, a plurality of rectangular or substantially rectangular piezoelectric elements 15A may be concentrically provided on the lower surface of the vibrating plate 16A. In addition, the hollow circular or substantially circular piezoelectric element 15A may be provided on an upper surface of the vibrating plate 16A. Further, a plurality of rectangular or substantially rectangular piezoelectric elements 15A may be concentrically provided on the upper surface of the vibrating plate 16A. Further, the piezoelectric element 15A may have a shape corresponding to the shape of the vibrating plate 16A, and the piezoelectric element 15A and the vibrating plate 16A may be integrally provided.

Preferred Embodiment 2

Figure 8:
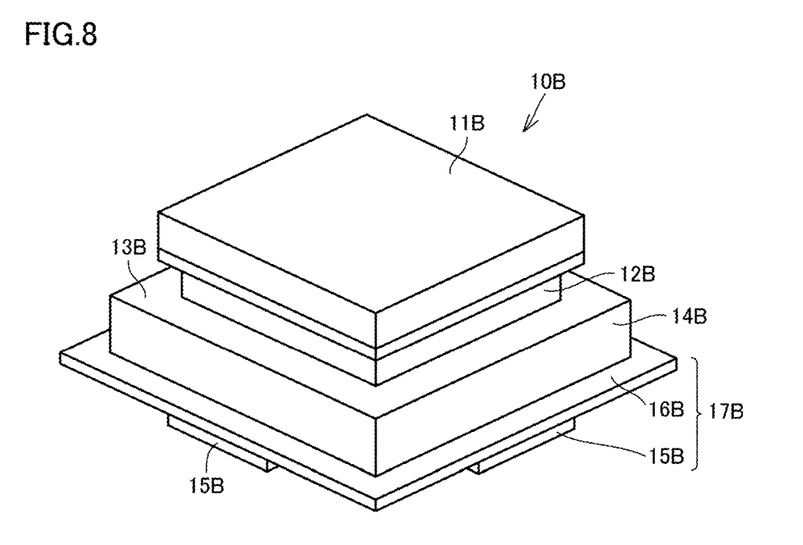
FIG. 8 is a perspective view of a vibration device according to Preferred Embodiment 2 of the present invention.
Figure 9:
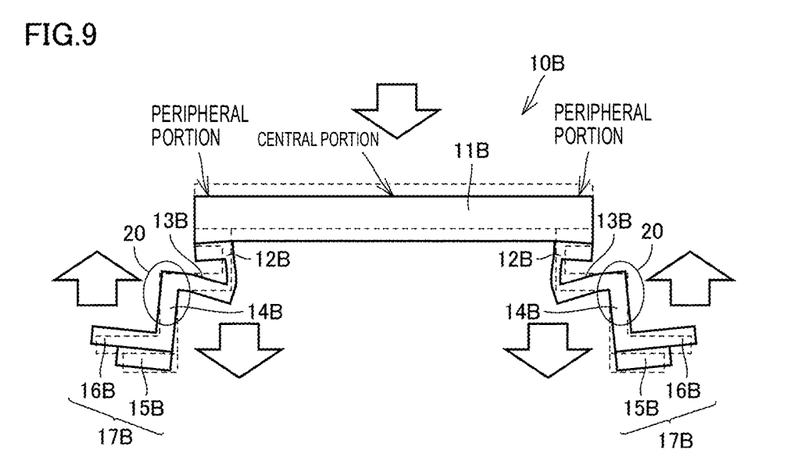
FIG. 9 is a diagram for explaining vibration of the vibration device according to Preferred Embodiment 2 of the present invention.

Referring to FIG. 8 and FIG. 9, Preferred Embodiment 2 of the present invention will be described. Note that the same or corresponding components as those in Preferred Embodiment 1 are denoted by the same reference numerals, and the description thereof will not be repeated. The vibration device 10 according to Preferred Embodiment 1 includes a member that has a circular or substantially circular shape when the first cylindrical body 12 is viewed from the axial direction (see FIG. 1). On the other hand, the vibration device according to Preferred Embodiment 2 is configured includes a member that has a rectangular or substantially rectangular shape when the first cylindrical body is viewed from the axial direction. The vibration device according to Preferred Embodiment 2 is mounted on the imaging unit and is used in the same or substantially the same manner as the vibration apparatus 10 according to Preferred Embodiment 1.

FIG. 8 is a perspective view of a vibration device 10B according to Preferred Embodiment 2. The vibration device 10B is different from the vibration device 10 in that a protective cover 11B, a first cylindrical body 12B, a plate spring 13B, a second cylindrical body 14B, and a vibrating body 17B have a rectangular or substantially rectangular shape when the first cylindrical body 12B is viewed from the axial direction. Further, the vibration device 10B differs from the vibration device 10 in that a plurality of piezoelectric elements 15B is provided along a shape of a vibrating plate 16B.

FIG. 9 is a diagram for explaining vibration of the vibration device 10B according to Preferred Embodiment 2. In FIG. 9, a reference position of the vibration device 10B before the start of the vibration is indicated by a broken line, and a position of the vibration device 10B after the displacement is indicated by a solid line. The piezoelectric element 15B vibrates in the axial direction of the second cylindrical body 14B based on the drive signal from the excitation circuit 2 (see FIG. 2), such that the vibrating plate 16B is displaced upward. Therefore, the second cylindrical body 14B is also displaced upward and the position of the plate spring 13B supporting the first cylindrical body 12B sinks downward. As the position of the plate spring 13B supporting the first cylindrical body 12B sinks downward, the entirety of the first cylindrical body 12B is displaced downward, and as a result, the entirety of the protective cover 11B held by the first cylindrical body 12B is also displaced downward. At this time, the node (the portion that is not displaced even by the vibration of the piezoelectric element 15B) 20 is provided on a side surface of the second cylindrical body 14B.

Although not illustrated, the piezoelectric element 15B vibrates in the axial direction of the second cylindrical body 14B based on the drive signal from the excitation circuit 2 (see FIG. 2), such that the vibrating plate 16B is displaced downward. Therefore, the second cylindrical body 14B is also displaced downward, and the position of the plate spring 13B supporting the first cylindrical body 12B rises upward. As the position of the plate spring 13B supporting the first cylindrical body 12B rises upward, the entirety of the first cylindrical body 12B is displaced upward, and as a result, the entirety of the protective cover 11B held by the first cylindrical body 12B is also displaced upward. At this time, the node 20 is provided on the side surface of the second cylindrical body 14B.

As described above, since the vibration device 10B can vibrate the protective cover 11B in the piston vibration mode similarly to the vibration device 10, the same or substantially the same advantageous effects as those of the vibration device 10 are obtained. In addition, in the vibration device 10B, when the first cylindrical body 12B is viewed from the axial direction, the protective cover 11B, the first cylindrical body 12B, the plate spring 13B, the second cylindrical body 14B, and the vibrating body 17B have a rectangular or substantially rectangular shape, so that it is possible to use the member without waste, and it is possible to reduce the manufacturing cost because cutting is easily performed.

Note that, in the vibration device 10B, when the first cylindrical body 12B is viewed from the axial direction, the protective cover 11B, the first cylindrical body 12B, the plate spring 13B, the second cylindrical body 14B, and the vibrating body 17B may have a rectangular or substantially rectangular shape, and also may be a square, a rectangle, or a polygon, for example.

Further, in the vibration device 10B, one sheet of piezoelectric elements 15B along the shape of the vibrating plate 16B may be provided on a lower surface of the vibrating plate 16B. Further, the piezoelectric element 15B may be provided on an upper surface of the vibrating plate 16B.

As shown in the modified example of Preferred Embodiment 1, the vibrating body 17B may extend toward an inside of the vibration device 10B. Specifically, the vibrating plate 16B may extend inward from a position that supports a bottom surface of the second cylindrical body 14B, and the piezoelectric element 15B may be provided on the upper surface or the lower surface of the vibrating plate 16B.

Preferred Embodiment 3

Figure 10:
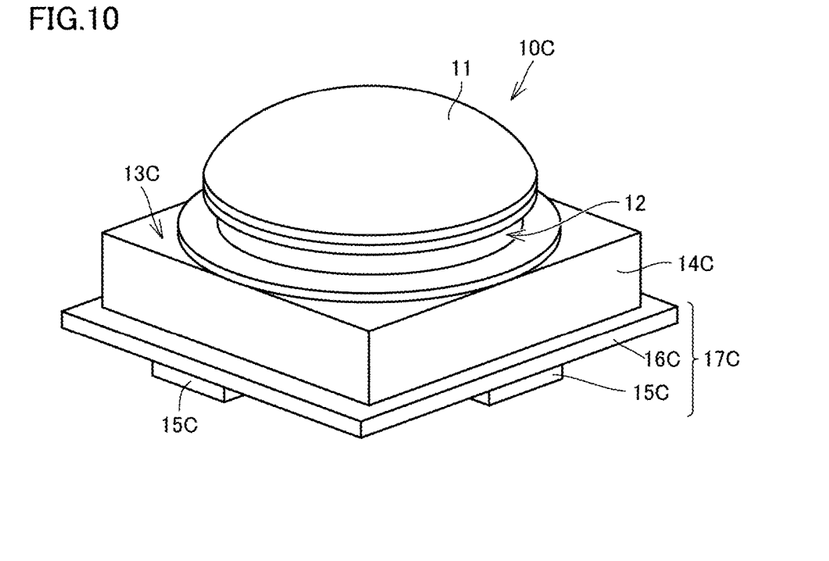
FIG. 10 is a perspective view of a vibration device according to Preferred Embodiment 3 of the present invention.

With reference to FIG. 10, Preferred Embodiment 3 of the present invention will be described. Note that the same or corresponding components as those in Preferred Embodiment 1 are denoted by the same reference numerals, and the description thereof will not be repeated. The vibration device 10 according to Preferred Embodiment 1 includes a member that has a circular or substantially circular shape when the first cylindrical body 12 is viewed from the axial direction (see FIG. 1). The vibration device 10B according to Preferred Embodiment 2 includes a member that has a rectangular or substantially rectangular shape when the first cylindrical body 12B is viewed from the axial direction (see FIG. 8). On the other hand, a vibration device according to Preferred Embodiment 3 includes a member that has a circular or substantially circular shape and a member that has a rectangular or substantially rectangular shape when the first cylindrical body is viewed from the axial direction. The vibration device according to Preferred Embodiment 3 is mounted on the imaging unit and is used in the same or substantially the same manner as the vibration apparatus 10 according to Preferred Embodiment 1.

FIG. 10 is a perspective view of a vibration device 10C according to Preferred Embodiment 3. The vibration device 10C differs from the vibration device 10 in that when the first cylindrical body 12 is viewed from the axial direction, the protective cover 11 and the first cylindrical body 12 have a circular or substantially circular shape, whereas a plate spring 13C, a second cylindrical body 14C, and a vibrating body 17C have a rectangular or substantially rectangular shape. Further, the vibration device 10C differs from the vibration device 10 in that a plurality of piezoelectric elements 15C is provided along a shape of a vibrating plate 16C. On the other hand, as similar to the vibration device 10, the vibration device 10C can vibrate the protective cover 11 in the piston vibration mode.

Specifically, the piezoelectric element 15C vibrates in the axial direction of the second cylindrical body 14C based on the drive signal from the excitation circuit 2 (see FIG. 2), such that the vibrating plate 16C is displaced upward. Therefore, the second cylindrical body 14C is also displaced upward, and the position of the plate spring 13C that supports the first cylindrical body 12 sinks downward. As the position of the plate spring 13C supporting the first cylindrical body 12 sinks downward, the entirety of the first cylindrical body 12 is displaced downward, and as a result, the entirety of the protective cover 11 held by the first cylindrical body 12 is also displaced downward. At this time, the side surface of the second cylindrical body 14C is not displaced even by the vibration of the piezoelectric element 15C.

Further, the piezoelectric element 15C vibrates in the axial direction of the second cylindrical body 14C based on the drive signal from the excitation circuit 2 (see FIG. 2), such that the vibrating plate 16C is displaced downward. Therefore, the second cylindrical body 14C is also displaced downward, and the position of the plate spring 13C supporting the first cylindrical body 12 rises upward. As the position of the plate spring 13C supporting the first cylindrical body 12 rises upward, the entirety of the first cylindrical body 12 is displaced upward, and as a result, the entirety of the protective cover 11 held by the first cylindrical body 12 is also displaced upward. At this time, the side surface of the second cylindrical body 14C is not displaced even by the vibration of the piezoelectric element 15C.

As described above, since the vibration device 10C can vibrate the protective cover 11 in the piston vibration mode similarly to the vibration device 10, the same or substantially the same advantageous effects as those of the vibration device 10 can be obtained. In addition, in the vibration device 10C, when the first cylindrical body 12 is viewed from the axial direction, the plate spring 13C, the second cylindrical body 14C, and the vibrating body 17C have a rectangular or substantially rectangular shape, so that it is possible to use the member without waste, and it is possible to reduce the manufacturing cost because cutting is easily performed.

Note that in the vibration device 10C, when the first cylindrical body 12 is viewed from the axial direction, the plate spring 13C, the second cylindrical body 14C, and the vibrating body 17C may have a rectangular or substantially rectangular shape, and also may be a square, a rectangle, or a polygon, for example.

In addition, in the vibration device 10C, the plate spring 13C, the second cylindrical body 14C, and the vibrating body 17C have a rectangular or substantially rectangular shape when the first cylindrical body 12 is viewed from the axial direction. However, the present invention is not limited thereto, and at least one of the protective cover 11, the first cylindrical body 12, the plate spring 13C, the second cylindrical body 14C, and the vibrating body 17C may have a rectangular or substantially rectangular shape when the first cylindrical body 12 is viewed from the axial direction.

In addition, in the vibration device 10C, the protective cover 11 and the first cylindrical body 12 have a circular or substantially circular shape when the first cylindrical body 12 is viewed from the axial direction. However, the present invention is not limited thereto, and at least one of the protective cover 11, the first cylindrical body 12, the plate spring 13C, the second cylindrical body 14C, and the vibrating body 17C may have a circular or substantially circular shape when the first cylindrical body 12 is viewed from the axial direction.

Further, in the vibration device 10C, one sheet of piezoelectric elements 15C along the shape of the vibrating plate 16C may be provided on a lower surface of the vibrating plate 16C. Further, the piezoelectric element 15C may be provided on an upper surface of the vibrating plate 16C.

As shown in the modified example of Preferred Embodiment 1, the vibrating body 17C may extend toward an inside of the vibration device 10C. Specifically, the vibrating plate 16C may extend inward from a position that supports a bottom surface of the second cylindrical body 14C, and the piezoelectric element 15C may be provided on the upper surface or the lower surface of the vibrating plate 16C.

The imaging unit 100 according to the above-described preferred embodiments may include a camera, a LiDAR, a Rader, and the like, for example. In addition, a plurality of imaging units may be provided side by side.

The imaging unit 100 according to the above-described preferred embodiments is not limited to the imaging unit provided in a vehicle, and can be applied to any imaging unit that includes a vibration device and an imaging element arranged so that the light transmissive body is in the field of view direction, and that needs to remove the foreign matter on the light transmissive body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A vibration device comprising:
    a light transmissive body to transmit light with a predetermined wavelength;
    a first cylindrical body to hold the light transmissive body at one end;
    a plate-shaped spring portion to support another end of the first cylindrical body;
    a second cylindrical body to support, at one end, a portion of the spring portion in an outer side portion of a portion that supports the first cylindrical body;
    a vibrating body provided at another end of the second cylindrical body to vibrate in an axial direction of the second cylindrical body; and
    an excitation circuit to drive the vibrating body; wherein
    a resonant frequency of the light transmissive body is larger than a resonant frequency of the spring portion; and
    the excitation circuit selectively excites resonance of the light transmissive body and resonance of the spring portion.

2. The vibration device according to claim 1, wherein the vibrating body includes:
    a vibrating plate extending outward from the another end of the second cylindrical body; and
    a piezoelectric element provided on an upper surface or a lower surface of the vibrating plate.

3. The vibration device according to claim 1, wherein the vibrating body includes:
    a plate-shaped vibrating plate extending inward from the another end of the second cylindrical body; and
    a piezoelectric element provided on an upper surface or a lower surface of the vibrating plate.

4. The vibration device according to claim 1, wherein a resonant frequency of the light transmissive body is equal to or more than about 1.2 times a resonant frequency of the spring portion.

5. The vibration device according to claim 1, wherein the excitation circuit drives the vibrating body so that the first cylindrical body and the second cylindrical body vibrate in opposite phase from one another in an axial direction.

6. The vibration device according to claim 1, wherein at least one of the light transmissive body, the first cylindrical body, the spring portion, the second cylindrical body, and the vibrating body has a circular or substantially circular shape when the first cylindrical body is viewed from the axial direction.

7. The vibration device according to claim 1, wherein at least one of the light transmissive body, the first cylindrical body, the spring portion, the second cylindrical body, and the vibrating body has a rectangular or substantially rectangular shape when the first cylindrical body is viewed from the axial direction.

8. The vibration device according to claim 1, wherein the light transmissive body has a dome shape.

9. The vibration device according to claim 1, wherein the light transmissive body has a plate shape.

10. An imaging unit comprising:
    the vibration device according to claim 1; and
    an imaging element arranged so that the light transmissive body is in a field of view direction.

11. A vibration device comprising:
    a light transmissive body to transmit light with a predetermined wavelength;
    a first cylindrical body to hold the light transmissive body at one end;
    a plate-shaped spring portion to support another end of the first cylindrical body;
    a second cylindrical body to support, at one end, a portion of the spring portion in an outer side portion of a portion that supports the first cylindrical body; and
    a vibrating body provided at another end of the second cylindrical body to vibrate in an axial direction of the second cylindrical body; wherein
    a thickness of the first cylindrical body is shorter than a length from a position of the spring portion that supports the first cylindrical body to a position of the spring portion that is supported by the second cylindrical body.

12. The vibration device according to claim 11, wherein
    a resonant frequency of the light transmissive body is larger than a resonant frequency of the spring portion;
    an excitation circuit to drive the vibrating body is further included; and
    the excitation circuit selectively excites resonance of the light transmissive body and resonance of the spring portion.

13. A vibration device comprising:
    a light transmissive body to transmit light with a predetermined wavelength;
    a first cylindrical body to hold the light transmissive body at one end;
    a plate-shaped spring portion to support another end of the first cylindrical body;
    a second cylindrical body to support, at one end, a portion of the spring portion in an outer side portion of a portion that supports the first cylindrical body; and a vibrating body provided at another end of the second cylindrical body to vibrate in an axial direction of the second cylindrical body; wherein the vibrating body includes:
- a vibrating plate extending outward from the another end of the second cylindrical body; and
- a piezoelectric element provided on an upper surface or a lower surface of the vibrating plate; and the vibrating body includes the vibrating plate that is provided with the piezoelectric element integrally provided along a shape of the vibrating plate.

14. A vibration device comprising:
a light transmissive body to transmit light with a predetermined wavelength;
a first cylindrical body to hold the light transmissive body at one end;
a plate-shaped spring portion to support another end of the first cylindrical body;
a second cylindrical body to support, at one end, a portion of the spring portion in an outer side portion of a portion that supports the first cylindrical body; and
a vibrating body provided at another end of the second cylindrical body to vibrate in an axial direction of the second cylindrical body; wherein the vibrating body includes:
- a vibrating plate extending outward from the another end of the second cylindrical body; and
- a piezoelectric element provided on an upper surface or a lower surface of the vibrating plate;

the vibrating body includes a plurality of the rectangular or substantially rectangular piezoelectric elements provided along a shape of the vibrating plate.

15. An imaging unit comprising:
a vibration device including:
- a light transmissive body to transmit light with a predetermined wavelength;
- a first cylindrical body to hold the light transmissive body at one end;
- a plate-shaped spring portion to support another end of the first cylindrical body;
- a second cylindrical body to support, at one end, a portion of the spring portion in an outer side portion of a portion that supports the first cylindrical body;
- a vibrating body provided at another end of the second cylindrical body to vibrate in an axial direction of the second cylindrical body; and
- an excitation circuit to drive the vibrating body; and
an imaging element arranged so that the light transmissive body is in a field of view direction; wherein
a resonant frequency of the light transmissive body is larger than a resonant frequency of the spring portion; and
the excitation circuit selectively excites resonance of the light transmissive body and resonance of the spring portion.

16. The imaging unit according to claim 15, wherein the vibrating body includes:
- a vibrating plate extending outward from the another end of the second cylindrical body; and
- a piezoelectric element provided on an upper surface or a lower surface of the vibrating plate.

17. The imaging unit according to claim 15, wherein the vibrating body includes:
- a plate-shaped vibrating plate extending inward from the another end of the second cylindrical body; and
- a piezoelectric element provided on an upper surface or a lower surface of the vibrating plate.

18. The imaging unit according to claim 15, wherein a resonant frequency of the light transmissive body is equal to or more than about 1.2 times a resonant frequency of the spring portion.

19. The imaging unit according to claim 15, wherein the excitation circuit drives the vibrating body so that the first cylindrical body and the second cylindrical body vibrate in opposite phase from one another in an axial direction.

20. The imaging unit according to claim 15, wherein at least one of the light transmissive body, the first cylindrical body, the spring portion, the second cylindrical body, and the vibrating body has a circular or substantially circular shape when the first cylindrical body is viewed from the axial direction.

* * * * *